United States Patent [19]
Warmerdam et al.

[11] Patent Number: 5,502,632
[45] Date of Patent: Mar. 26, 1996

[54] HIGH VOLTAGE INTEGRATED CIRCUIT DRIVER FOR HALF-BRIDGE CIRCUIT EMPLOYING A BOOTSTRAP DIODE EMULATOR

[75] Inventors: Leo F. P. Warmerdam, Nijmegen, Netherlands; Anand Janaswamy, Sunnyvale, Calif.

[73] Assignee: Philips Electronics North America Corporation, New York, N.Y.

[21] Appl. No.: 275,569

[22] Filed: Jul. 15, 1994

Related U.S. Application Data

[63] Continuation-in-part of Ser. No. 155,053, Nov. 19, 1993, Pat. No. 5,373,435, which is a continuation of Ser. No. 160,176, May 7, 1993, abandoned.

[51] Int. Cl.$^6$ .......................... H02M 3/24; H02M 3/335
[52] U.S. Cl. ................................. 363/98; 363/17
[58] Field of Search .................. 363/16, 17, 56, 363/97, 98, 131, 132; 327/387, 390, 423, 494

[56] References Cited

U.S. PATENT DOCUMENTS

| | | | |
|---|---|---|---|
| 4,633,381 | 12/1986 | Upadhyay | 363/56 |
| 4,685,040 | 8/1987 | Steigerwald et al. | 363/17 |
| 4,740,717 | 4/1988 | Fletcher et al. | 307/443 |
| 4,796,145 | 1/1989 | Oshikiri | 361/57 |
| 4,908,551 | 3/1990 | Ludikhuize et al. | 315/209 R |
| 4,989,127 | 1/1991 | Wegener | 363/16 |
| 5,365,118 | 11/1994 | Wilcox | 327/109 |
| 5,373,435 | 12/1994 | Jayaraman et al. | 363/98 |
| 5,408,150 | 4/1995 | Wilcox | 327/108 |
| 5,408,403 | 4/1995 | Nerone et al. | 363/98 |
| 5,410,466 | 4/1995 | Maehara | 363/98 |

Primary Examiner—Matthew V. Nguyen
Attorney, Agent, or Firm—Jack D. Slobod

[57] ABSTRACT

A half-bridge driver circuit including a lower drive module and a floating upper drive module for driving respective external upper and lower power transistors of a high voltage half bridge is contained in an integrated circuit chip which includes an on-chip bootstrap diode emulator for charging an external bootstrap capacitor that powers the upper drive module. The upper drive is accommodated in an insulated well and the diode emulator includes as its main current carrying element, a LDMOS transistor formed along the periphery of the well. The LDMOS transistor is driven into a conducting state at the same time the lower power transistor is driven into a conducting state. A clamp and current source solidly bias the backate of the LDMOS while limiting the current drawn by a parasitic transistor attached to the backgate during startup of the LDMOS.

10 Claims, 2 Drawing Sheets

5,502,632

HIGH VOLTAGE INTEGRATED CIRCUIT DRIVER FOR HALF-BRIDGE CIRCUIT EMPLOYING A BOOTSTRAP DIODE EMULATOR

RELATED APPLICATIONS

This is a continuation-in-part under 37 C.F.R. §1.53 of application Ser. No. 08/155,053, filed Nov. 19, 1993 and which issued on Dec. 13, 1994 as U.S. Pat. No. 5,373,435, said application being a continuation of application Ser. No.08/160,176, filed May 7, 1993 and now abandoned.

BACKGROUND OF THE INVENTION

1. Field of the Invention

The present invention relates to high voltage half-bridge circuits where one end of a load is driven from an output terminal at a junction between lower and upper alternately conducting power transistors that are connected in series across a high voltage DC supply. In its particular aspects, the present invention relates to circuitry for charging a bootstrap capacitor which provides to an upper drive circuit that controls the state of the upper transistor, a bootstrap power supply voltage floating on the voltage at the output terminal.

2. Description of the Related Art

Applications of high voltage half-bridge circuits include electronic ballasts for gas discharge lamps, switched mode power supplies, motor drives, and DC to AC converters.

A half-bridge driver circuit of the type mentioned, most of which is accommodated in a high voltage integrated circuit (HVIC), is known from U.S. Pat. No. 4,989,127, granted Jan. 29, 1991. This patent is assigned to the same assignee as the present application and is herein incorporated by reference. It discloses the general architecture of the driver circuit as including lower and upper drives for controlling the lower and upper power transistors, respectively. The upper drive comprises CMOS circuitry located in a floating well within the HVIC. Adequate breakdown voltage between this floating CMOS circuitry and the balance of the HVIC is achieved because the design of the well periphery is equivalent to that used to form Lateral Diffused Metal Oxide Semiconductor (LDMOS) transistors. The upper drive is powered by a bootstrap capacitor.

European Patent Application 0 318 110, which corresponds to U.S. Pat. No. 4,908,551, discloses a half-bridge circuit, where, as is now conventional, a bootstrap capacitor powering the upper drive is charged via a diode from a low voltage power supply voltage. The latter low voltage is formed across an off-chip high voltage diode.

In present high voltage integrated circuit half-bridge driver circuits of the type considered herein, both the bootstrap capacitor and the diode via which the bootstrap capacitor is charged are discrete components provided off-chip. This is because the presently needed capacitance value of the bootstrap capacitor, in excess of 50 nf, is too large to be feasibly produced on chip, and the breakdown voltage and peak current capacity needed in the bootstrap capacitor charging diode have also heretofore been thought to be beyond what may feasibly be accommodated with reasonable cost of space in the HVIC.

These discrete components are costly and not as reliable as they would be if incorporated in the HVIC.

SUMMARY OF THE INVENTION

It is an object of the present invention to provide a high voltage integrated circuit half-bridge driver circuit which includes on-chip circuitry emulating a diode of adequate breakdown voltage and current capacity via which the bootstrap capacitor is charged.

Briefly, the aforementioned and other objects of the present invention are satisfied by a driver circuit, comprised in a monolithic integrated circuit chip, for driving a half-bridge formed by lower and upper power transistors connected between an output terminal and respective lower and upper rails of a high voltage DC supply, and for charging a bootstrap capacitor, provided off-chip, which powers an on-chip upper drive module that controls the upper power transistor. The bootstrap capacitor has one end connected to the output terminal of the half-bridge. In accordance with the present invention, a bootstrap diode emulator means is provided on-chip for charging the bootstrap capacitor to a bootstrap voltage. The bootstrap diode emulator means comprises a further transistor having a high current first electrode connected to a relatively low voltage power supply output provided on-chip, a high current second electrode adapted to be connected to the other end of the bootstrap capacitor and a control third electrode coupled to a further control signal, derived on-chip from a lower drive command signal, for driving the further transistor to a conducting state when the lower power transistor is driven to a conducting state.

The upper drive module is accommodated in an insulated well formed in the monolithic integrated circuit chip, and the further transistor comprises an elongated LDMOS transistor formed along a portion of the periphery of the well, the first, second and third electrodes of the further transistor respectively being the source, drain and gate electrodes of this LDMOS transistor. Current through the LDMOS transistor flows perpendicular to the periphery of the well, enabling the required current carrying capacity to be obtained by choosing a sufficient length of the LDMOS along the well periphery. The breakdown voltage of the LDMOS transistor is governed by the properties of the insulation of the well periphery because the floating well is formed at its periphery by structure equivalent to that used in forming an LDMOS.

In order to actively place the LDMOS transistor into a conductive state only when the lower power transistor is driven into a conductive state, the further control signal is derived by a buffer fed by the lower drive command signal to produce a buffer output signal having a voltage range between the lower rail and the relatively low supply voltage. Means are provided for translating the voltage range of the buffer output signal to a range of voltage difference between a point coupled to the gate electrode of the LDMOS transistor and its source electrode.

Inherent in an LDMOS device are parasitic transistors, one of which is a parasitic PNP transistor whose emitter and base are respectively the backgate and drain of the LDMOS and whose collector is the substrate of the IC. It has been found that during startup of the LDMOS in the charging cycle, the parasitic PNP transistor will shunt some current from the backgate to the substrate reducing the current available for charging the bootstrap capacitor. In accordance with the principals of the present invention, means are provided for limiting the emitter to collector current through the parasitic PNP. These means include the combination of a current source and a clamping PNP transistor which provide a solid biasing of the backgate during normal operation to a sufficient value to produce an acceptably small emitter to collector current during startup. Further, a capacitor is connected between the backgate and source of the LDMOS to collect the charge that the backgate injects during a voltage transient at the drain.

In accordance with another feature of the present invention, which is useful for preventing spurious driving of the LDMOS transistor into a conducting state in response to a voltage spike produced when the lower power transistor turns off, another transistor is provided for clamping the gate electrode to the source electrode of the LDMOS transistor in response to a voltage developed across a resistor in series with the gate electrode which is due to leakage current flowing in a Miller capacitance of the LDMOS transistor coupled between its drain and gate electrodes.

Other objects, features and advantages of the present invention will become apparent upon perusal of the following detailed description when taken in conjunction with the appended drawing, wherein:

DETAILED DESCRIPTION OF THE PREFERRED EMBODIMENTS

Figure 1:
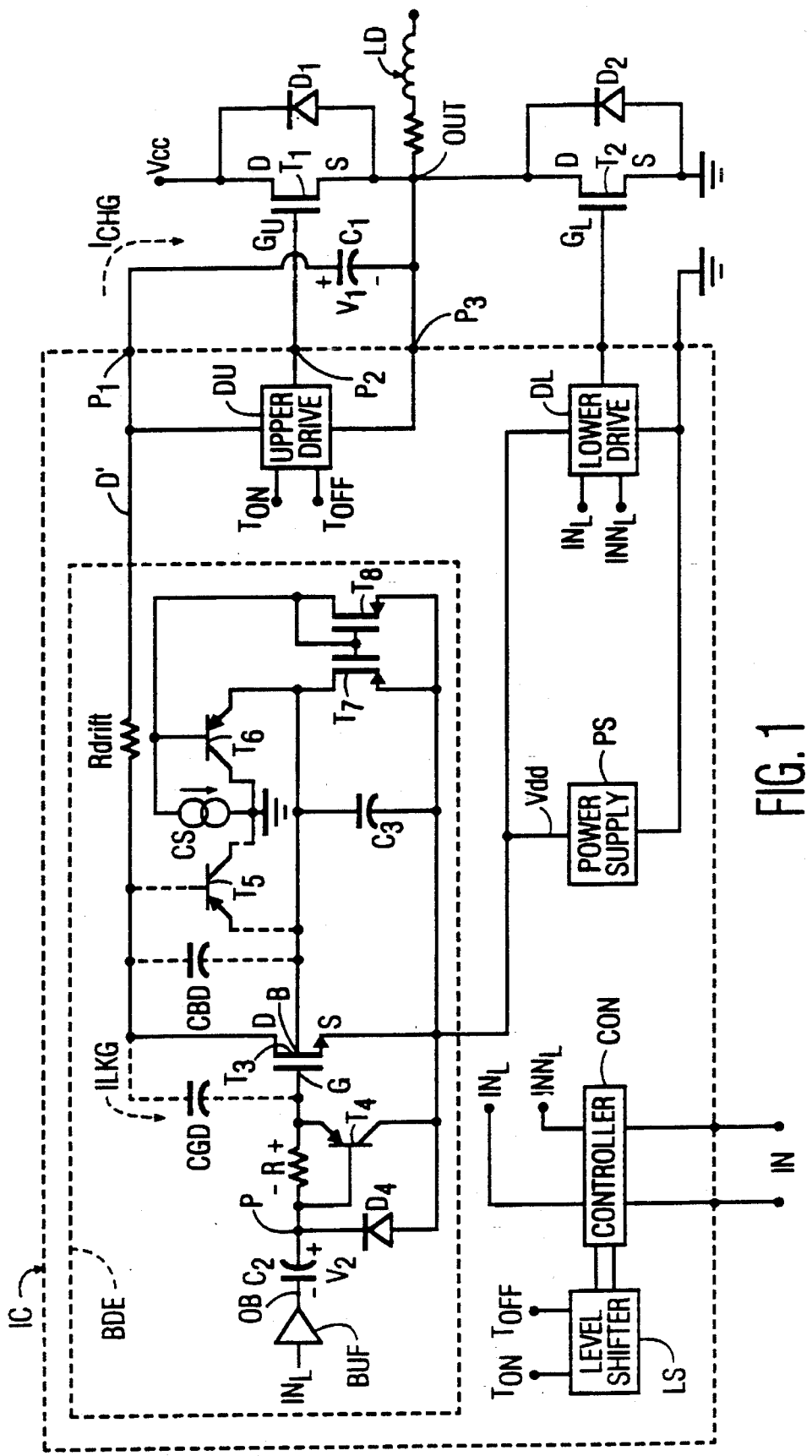
FIG. 1 is a schematic diagram of the driver circuit of the present invention in which components comprised in an integrated circuit chip are enclosed in a dashed box labelled IC.

Referring first to FIG. 1, there is shown a driver circuit in accordance with the present invention, contained in a monolithic high voltage integrated circuit IC, connected for driving an external half-bridge formed by power MOSFET's $T_1$ and $T_2$ connected in series across a high voltage (up to about 500 Volts) DC supply. The general circuit architecture of the half-bridge and driver is the same as shown and described in the aforementioned U.S. Pat. No. 4,989,127, with the exception of the provision of an on-chip bootstrap diode emulator BDE in accordance with the present invention.

In the half-bridge, power transistor $T_1$ is referred to as the upper transistor because its drain electrode is connected to the high side or upper rail of the DC supply, indicated in FIG. 1 as at the potential $V_{cc}$ and power transistor $T_2$ is referred to as the lower transistor because its source electrode is connected to the low side or lower rail of the DC supply, indicated in the figure as at the potential of power ground. The source electrode of upper transistor $T_1$ and the drain electrode of lower transistor $T_2$ are joined at the output terminal OUT of the half-bridge which is also connected to one end of a load LD. In power supply applications such as powering gas discharge lamps, the other end of the load may be maintained at a potential of half the supply voltage by being connected to the midpoint of a capacitive voltage divider (not shown) across the DC supply. As is well known, the transistors $T_1$ and $T_2$ are operated in a switch mode with respect to a high frequency (greater than 20 kHz) repetitive cycle, e.g. on the order of 100 KHz, where each is turned on (i.e. driven into a conducting state) during a different one of two time intervals or phases during a cycle, which are separated from each other by relatively small dead zone intervals on the order of about 500 ns. Switching transients at current turnoff due to load LD having in many applications a somewhat inductive impedance are limited by the inherent body diodes $D_1$ and $D_2$ of $T_1$ and $T_2$, respectively. $D_1$ is directed for limiting a positive voltage transient produced at output terminal OUT when the lower power transistor $T_2$ is turned off and diode $D_2$ is directed for limiting a negative voltage transient produced at the output terminal when the upper power transistor $T_1$ is turned off.

These cycles are established by a controller CON, which in response to an external input signal IN produces an essentially binary command signal $IN_L$ and its logical inverse $INN_L$ for controlling the conducting state of lower transistor $T_1$ and via level shifter LS produces pulse command signals $T_{ON}$ and $T_{OFF}$ for controlling the conducting state of the upper transistor $T_2$. Command signal $IN_L$ has one binary state only during the time interval or phase when lower transistor $T_1$ is to be driven into a conducting state. The command signals $T_{ON}$ and $T_{OFF}$ are provided in pulse form for noise and transient immunity purposes; $T_{ON}$ and $T_{OFF}$ indicate the instants when the upper transistor $T_2$ is to be turned on and off, respectively. The lower transistor command signals $IN_L$ and $INN_L$ are fed to a lower drive module DL which in response thereto drives the gate $G_L$ of lower transistor $T_2$ to turn on the lower transistor only during the phase defined by the lower transistor command signals. In a similar manner, command signals $T_{ON}$ and $T_{OFF}$ are fed to an upper drive module DU which in response thereto drives the gate $G_U$ of upper transistor $T_1$ to turn on the upper transistor during the phase defined by the upper transistor command signals. An R/S flip flop (not shown) within the upper drive module DU converts the command signals $T_{ON}$ and $T_{OFF}$ to binary form similar to $IN_L$ and $IN_{LL}$ in order that the balance of the upper drive module may be of the same design as the lower drive module DL.

Lower drive module DL is powered by a relatively low power supply voltage $V_{dd}$, e.g. 12 Volts, and upper drive module is powered by the voltage $V_1$ across an external bootstrap capacitor $C_1$, having a capacitance on the order of 70 nf, which is too large to be produced in integrated circuit IC with reasonable cost of area. One end of bootstrap capacitor $C_1$ is connected to a junction between the point $P_3$ and the output terminal OUT. The other end of bootstrap capacitor $C_1$ is coupled to the supply voltage $V_{dd}$ via on-chip bootstrap diode emulator BDE, so that a charging current flows in C1 when the output terminal OUT is maintained substantially at ground potential during the time when lower transistor $T_1$ is in a conducting state, to bring $V_1$ to a voltage of $V_{dd}$ less any small voltage drops across BDE and $T_2$.

Figure 2:
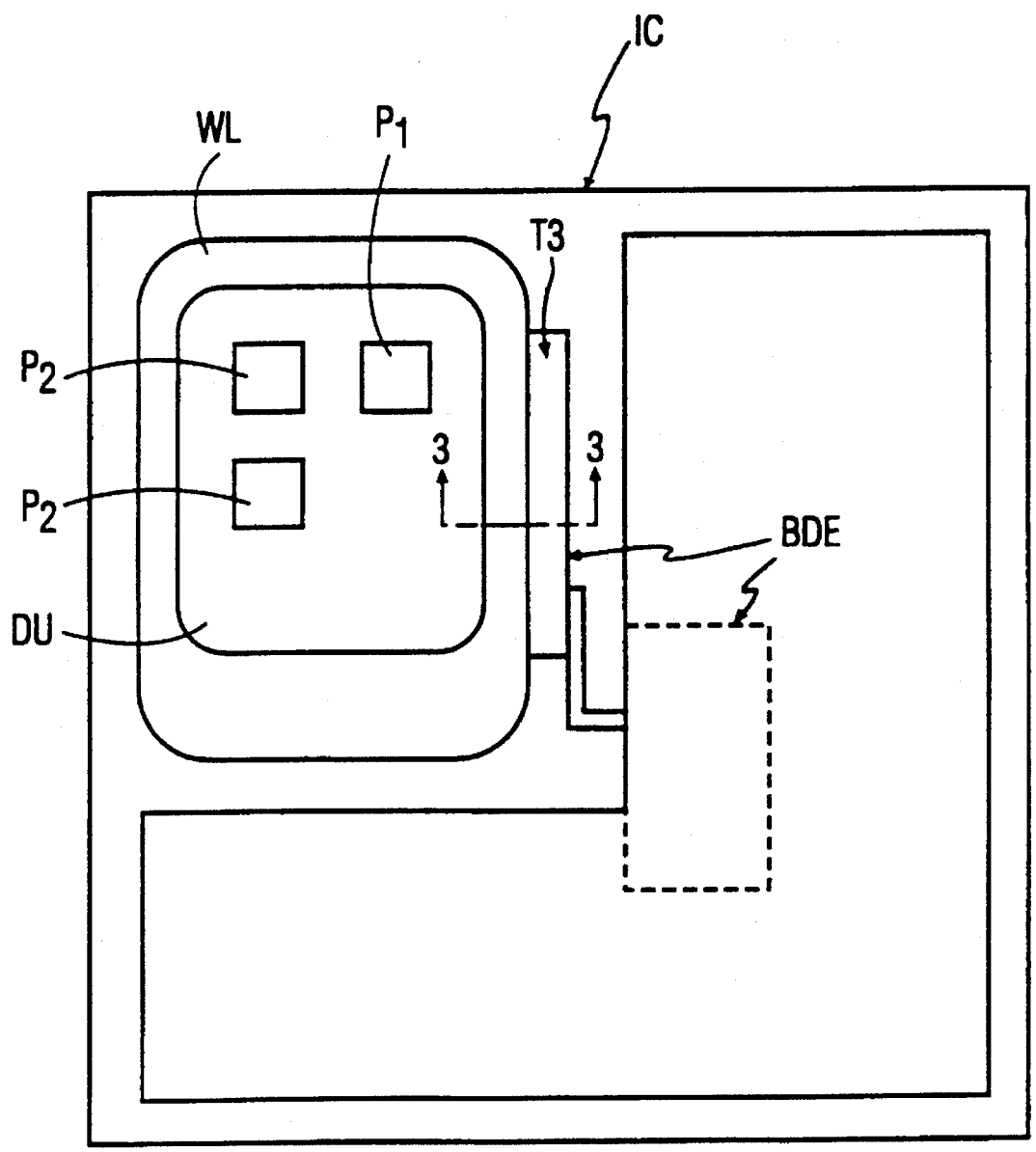
FIG. 2 is a schematic plan view of the integrated circuit chip corresponding to the dashed box IC in FIG. 1, including an elongated area in which a high voltage LDMOS $T_3$ is formed.

Now referring also to FIG. 2, as is known, the upper drive module DU comprises CMOS circuitry formed in an insulated well WL, in integrated circuit chip IC, e.g. an N-well surrounded by P isolation. Thus, well WL is insulated from the balance of the integrated circuit by structure similar to that used to produce a LDMOS transistor. A high voltage diode cannot be integrated in junction isolation technologies because it results in large substrate currents. This could upset the operation of other circuitry. In accordance with the principles of the present invention, a bootstrap diode emulator provided on-chip comprises a LDMOS $T_3$ that is formed along the periphery of the well WL. LDMOS $T_3$ inherently has the same breakdown voltage as the well isolation (in excess of 500 Volts) and because current flows perpendicular to the well periphery, adequate current carrying capacity can be obtained by choice of the extent of the well periphery along which it is formed. Further, the implementation of LDMOS $T_3$ does not require expenditure of additional area; a small amount of additional area on the integrated circuit is however required for the circuitry to drive $T_3$ so that it is in a conducting state only when lower transistor $T_2$ is driven into a conducting state.

As shown in FIG. 1, LDMOS $T_3$ is illustrated as an ideal device plus various inherent or parasitic elements. There is a parasitic PNP transistor $T_5$ whose emitter and base electrodes are the backgate B and drain D electrodes of LDMOS $T_3$ and whose collector electrode is connected to ground. The latter connection is because the substrate of integrated circuit IC is grounded. LDMOS $T_3$ also has parasitic capacitors CBD, between backgate and drain, and CGD between gate and drain and an inherent resistance $R_{drift}$ between the drain electrode of the ideal LDMOS and its actual drain electrode D'. This resistance is determined by the width of the LDMOS and temperature of operation. The width is chosen based on the application. A typical Ron at room temperature (25° C.) of the LDMOS (75 μm rift region) is 300Ω/mm of width.

LDMOS $T_3$ is operated in source follower configuration with its source electrode S connected to $V_{dd}$ and its actual drain electrode D' connected to the higher voltage end of bootstrap capacitor C1. In response to $T_3$ being turned on, the drain electrode D rises to $V_{dd}$ as bootstrap capacitor C1 is charged. During the startup of $T_3$ turning on, it is necessary to limit the current conducted by parasitic transistor $T_5$ from its emitter to its collector, since such conduction shunts current available for charging bootstrap capacitor C1 while also properly biasing the backgate of $T_3$ during normal operation in the charging cycle. This is done by providing a PNP transistor $T_6$ for clamping the backgate to a biasing voltage during normal operation and a current source feeding the backgate to limit the current through the parasitic transistor. The emitter of clamping transistor $T_6$ is connected to the backgate B (and therefore to the emitter of parasitic transistor $T_3$) and to the drain of a FET transistor $T_7$ which acts as current source by mirroring the current of a FET transistor $T_8$. The collector of transistor $T_6$ is connected to ground and its base is connected to the gates of transistors $T_7$, $T_8$, to the drain of transistor $T_8$ and to one end of a current source CS. The voltage at the base of transistor $T_6$ must be low-ohmic to provide a constant clamp level. The other end of current source CS is connected to ground. The sources of transistors $T_7$, $T_8$ are connected to the source S of LDMOS $T_3$. Further a capacitor C3 is connected between the backgate and source of LDMOS $T_3$.

It should be appreciated that the current of current source CS flows through transistor $T_8$ and by current mirror action the same current is replicated flowing through transistor $T_7$.

The capacitor C3 is destined to collect the charge that the backgate injects during a voltage transient at the drain D of $T_3$. It is vital that the backgate B remains negatively biased with respect to the source S of $T_3$. The value of C3 scales with the width of the LDMOS. As previously noted, that width is determined by the actual application.

As a result of the biasing of the backgate, a gate to source voltage of 4V is required to turn on LDMOS transistor $T_3$. In order to turn the LDMOS transistor $T_3$ on when the lower power transistor $T_2$ is driven into a conducting state, the lower drive command signal $IN_L$ is applied to a buffer amplifier BUF which produces at its output OB a signal which is at voltage $V_{dd}$ when the lower power transistor $T_2$ is driven into a conducting state and at zero Volts otherwise. This voltage is applied to a one end of a second relatively small bootstrap capacitor $C_2$ whose other end, at point P, is coupled to the supply voltage $V_{dd}$ via a diode $D_4$. Bootstrap capacitor $C_2$ has a capacitance of at least five times the gate capacitance of the transistor $T_3$. The buffer BUF has a sufficiently low output impedance that the second bootstrap capacitor $C_2$ is charged via diode $D_4$ to a voltage $V_2$ which equals $V_{dd}$ less one diode drop. This has the effect of translating the range of the voltage at the buffer output OB (greater than one diode drop) to appear directed between point P and the source electrode S of LDMOS transistor $T_3$.

Point P is connected to the gate electrode G of transistor $T_3$ via a resistor R of approximately 5K ohms. This resistor is used to develop a voltage which turns on an PNP transistor $T_4$ whose emitter, base and collector are connected respectively to the gate electrode of $T_3$, point P, and $V_{dd}$. To prevent spurious turning on of the LDMOS transistor $T_3$ due to switching transients at output OUT, a transistor $T_4$ actively pulls the gate of transistor $T_3$ down to $V_{dd}$ in response to a voltage across resistor R due to Miller current through $C_{GD}$. This current, which is caused by a large positive rate of change in voltage when the output voltage at output OUT slews from zero Volts to $V_{cc}$ and the drain electrode of LDMOS transistor $T_3$ slews over a corresponding range, would otherwise charge the gate capacitance to a turn on level. As a result, the bootstrap diode emulator BDE conducts only at the times a bootstrap diode would have conducted to correctly charge the bootstrap capacitor $C_1$.

It should now be apparent that the objects of the present invention have been satisfied in all respects. Further, while the present invention has been described in particular detail, it should also be appreciated that its principles have broad general applicability. Consequently, numerous modifications are possible in the details given within the intended spirit and scope of the invention.

What is claimed is:

1. A circuit for driving a half-bridge formed by lower and upper power transistors connected between an output terminal and respective lower and upper rails of a high voltage DC supply, and for charging a bootstrap capacitor having first and second ends, the first end being connected to said output terminal, said circuit comprising:

means for generating lower and upper drive command signals for commanding driving said respective lower and upper power transistors to non-contemporaneous conducting states;

power supply means for generating at a power supply output a relatively low control voltage with respect to said lower rail;

a lower drive module connected to the power supply output for being powered by said relatively low control voltage and comprising means for applying a lower drive control signal between a control electrode of the lower power transistor and the lower rail in response to said lower drive command signal;

an upper drive module adapted to be connected to the first end of the bootstrap capacitor for being powered by a bootstrap voltage across said bootstrap capacitor and comprising means for applying an upper transistor control signal between a control electrode of the upper power transistor and the output terminal in response to said upper drive input control signal; and bootstrap diode emulator means for charging said bootstrap capacitor to said bootstrap voltage, said bootstrap diode emulator means comprising a Lateral Diffused Metal Oxide Semiconductor (LDMOS) transistor having a source electrode connected to said power supply output, a drain electrode adapted to be connected to the second end of the bootstrap capacitor, a gate electrode coupled to a further control signal derived from said lower drive command signal for driving said LDMOS transistor to a conducting state when the lower power transistor is driven to a conducting state, and a backgate electrode, there being a parasitic transistor connected to said backgate electrode, and biasing and limiting means coupled to the backgate electrode for biasing the backgate electrode while limiting the current that said parasitic transistor can shunt away from said bootstrap capacitor.

2. A circuit as claimed in claim 1, wherein said biasing and limiting means comprises a clamping transistor and a current source connected to said backgate electrode.

3. A circuit as claimed in claim 2, wherein said current source comprises an output of a current mirror.

4. A circuit as claimed in claim 1, further comprising means for deriving said further control signal from said lower drive command signal, said means for deriving comprising a buffer fed by said lower drive command signal to produce a buffer output signal having a voltage range between said lower rail and said relatively low supply voltage, and means for translating the voltage range of said buffer output signal to a range of voltage difference between a point coupled to said gate electrode and said source electrode.

5. A circuit as claimed in claim 2, further comprising means for deriving said further control signal from said lower drive command signal, said means for deriving comprising a buffer fed by said lower drive command signal to produce a buffer output signal having a voltage range between said lower rail and said relatively low supply voltage, and means for translating the voltage range of said buffer output signal to a range of voltage difference between a point coupled to said gate electrode and said source electrode.

6. A circuit as claimed in claim 3, further comprising means for deriving said further control signal from said lower drive command signal, said means for deriving comprising a buffer fed by said lower drive command signal to produce a buffer output signal having a voltage range between said lower rail and said relatively low supply voltage, and means for translating the voltage range of said buffer output signal to a range of voltage difference between a point coupled to said gate electrode and said source electrode.

7. A circuit as claimed in claim 1, further comprising means for deriving said further control signal from said lower drive command signal, said means for deriving further comprising means for clamping said gate electrode to said source electrode of said LDMOS transistor in response to displacement current flowing in a Miller capacitance of said LDMOS transistor coupled between the drain and gate electrodes.

8. A circuit as claimed in claim 2, further comprising means for deriving said further control signal from said lower drive command signal, said means for deriving further comprising means for clamping said gate electrode to said drain electrode of said LDMOS transistor in response to displacement current flowing in a Miller capacitance of said LDMOS transistor coupled between the gate and drain electrodes.

9. A circuit as claimed in claim 3, further comprising means for deriving said further control signal from said lower drive command signal, said means for deriving further comprising means for clamping said gate electrode to said source electrode of said LDMOS transistor in response to displacement current flowing in a Miller capacitance of said LDMOS transistor coupled between the drain and gate electrodes.

10. A circuit as claimed in claim 4, wherein said means for deriving said further control signal from said lower drive command signal further comprises means for clamping said gate electrode to said source electrode of said LDMOS transistor in response to displacement current flowing in a Miller capacitance of said LDMOS transistor coupled between the drain and gate electrodes.

* * * * *